US010283933B1

(12) United States Patent
Feng et al.

(10) Patent No.: US 10,283,933 B1
(45) Date of Patent: May 7, 2019

(54) TRANSISTOR LASER ELECTRICAL AND OPTICAL BISTABLE SWITCHING

(71) Applicant: The Board of Trustees of The University of Illinois, Urbana, IL (US)

(72) Inventors: Milton Feng, Champaign, IL (US); Nick Holonyak, Jr., Urbana, IL (US); Mong-Kai Wu, Hillsboro, OR (US); Fei Tan, Santa Clara, CA (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 15/732,310

(22) Filed: Oct. 23, 2017

(51) Int. Cl.
*H01L 29/06* (2006.01)
*H01S 5/062* (2006.01)
(Continued)

(52) U.S. Cl.
CPC ...... *H01S 5/06203* (2013.01); *H01L 33/0025* (2013.01); *H01S 5/06226* (2013.01);
(Continued)

(58) Field of Classification Search
USPC ..... 257/9, 432–437, 749, E33.056–E33.059, 257/E25.032; 438/25–28, 83, 98, 100,
(Continued)

(56) References Cited

U.S. PATENT DOCUMENTS

| 5,499,206 A | 3/1996 | Muto | 365/114 |
| 6,005,791 A | 12/1999 | Gudesen | 365/114 |

(Continued)

OTHER PUBLICATIONS

M. Feng, N. Holonyak, and C.Y. Wang, Journal of Applied Physics 122, 103102 (2017).

(Continued)

*Primary Examiner* — Niki H Nguyen
(74) *Attorney, Agent, or Firm* — Martin Novack (57) ABSTRACT

A method for electrical and optical bistable switching, including the following steps: providing a semiconductor device that includes a semiconductor base region of a first conductivity type between semiconductor collector and emitter regions of a second conductivity type, providing a quantum size region in the base region, and providing base, collector and emitter terminals respectively coupled with the base, collector, and emitter regions; providing input electrical signals with respect to the base, collector, and emitter terminals to obtain an electrical output signal and light emission from the base region; providing an optical resonant cavity that encloses at least a portion of the base region and the light emission therefrom, an optical output signal being obtained from a portion of the light in the optical resonant cavity; and modifying the input electrical signals to switch back and forth between a first state wherein the photon density in the cavity is below a predetermined threshold and the optical output is incoherent, and a second state wherein the photon density in the cavity is above the predetermined threshold and the optical output is coherent, said switching from the first to the second state being implemented by modifying the input electrical signals to reduce optical absorption by collector intra-cavity photon-assisted tunneling, and the switching from the second to the first state being implemented by modifying the input electrical signals to increase photon absorption by collector intra-cavity photon-assisted tunneling.

19 Claims, 9 Drawing Sheets

(51) Int. Cl.

| | |
|---|---|
| H01S 5/183 | (2006.01) |
| H01S 5/34 | (2006.01) |
| H01L 33/00 | (2010.01) |
| H01S 5/30 | (2006.01) |
| H01S 5/32 | (2006.01) |
| H01S 5/343 | (2006.01) |

(52) U.S. Cl.
CPC ............ *H01S 5/183* (2013.01); *H01S 5/3054* (2013.01); *H01S 5/3211* (2013.01); *H01S 5/3407* (2013.01); *H01S 5/3415* (2013.01); *H01S 5/34313* (2013.01)

(58) Field of Classification Search
USPC ........ 438/101, 111, 112, 123, 124, 411, 412, 438/416, 584, 598–688, 29, 478, 32, 31, 438/46
See application file for complete search history.

(56) References Cited

U.S. PATENT DOCUMENTS

| | | | |
|---|---|---|---|
| 7,091,082 B2 | 8/2006 | Feng .......................... | 438/235 |
| 7,286,583 B2 | 10/2007 | Feng et al. ...................... | 372/30 |
| 7,354,780 B2 | 4/2008 | Feng et al. ...................... | 257/292 |
| 7,385,835 B2 | 6/2008 | Leedy ........................... | 365/114 |
| 7,535,034 B2 | 5/2009 | Walter et al. ................... | 372/43 |
| 7,693,195 B2 | 4/2010 | Feng et al. ..................... | 372/30 |
| 7,696,536 B1 | 4/2010 | Feng et al. ..................... | 257/197 |
| 7,711,015 B2 | 5/2010 | Holonyak, Jr. et al. ........ | 372/11 |
| 7,813,396 B2 | 10/2010 | Feng et al. .................. | 372/43.01 |
| 7,888,199 B2 | 2/2011 | Walter et al. ................. | 438/235 |
| 7,888,625 B2 | 2/2011 | Holonyak, Jr. et al. ...... | 250/214 |
| 7,953,133 B2 | 5/2011 | Holonyak, Jr. et al. ... | 372/43.01 |
| 7,998,807 B2 | 8/2011 | Feng et al. .................... | 438/235 |
| 8,005,124 B2 | 8/2011 | Then et al. .............. | 372/46.011 |
| 8,179,937 B2 | 5/2012 | Walter et al. ............. | 372/38.05 |
| 8,179,939 B2 | 5/2012 | Holonyak, Jr. et al. ... | 372/43.01 |
| 8,494,375 B2 | 7/2013 | Walter .......................... | 398/183 |
| 8,509,274 B2 | 8/2013 | Walter et al. ............. | 372/38.05 |
| 9,140,853 B2 | 9/2015 | Varghese .................. | G02B 6/12 |
| 9,478,942 B2 | 10/2016 | Feng ............................ | 365/114 |
| 2005/0040432 A1 | 2/2005 | Feng et al. .................... | 257/198 |
| 2005/0054172 A1 | 3/2005 | Feng .......................... | 438/313 |
| 2005/0163184 A1 | 7/2005 | Hilliard ........................... | 372/67 |
| 2008/0240173 A1 | 10/2008 | Holonyak et al. ................ | 372/9 |
| 2009/0097517 A1 | 4/2009 | Sakamoto et al. ......... | 372/44.01 |
| 2009/0134939 A1 | 5/2009 | Feng et al. .................... | 327/581 |
| 2010/0020484 A1 | 1/2010 | Holonyak, Jr. et al. ... | 372/45.01 |
| 2010/0034228 A1 | 2/2010 | Holonyak et al. ............. | 374/45 |
| 2010/0202483 A1 | 8/2010 | Walter et al. ............. | 372/45.01 |
| 2010/0202484 A1 | 8/2010 | Holonyak, Jr. et al. ... | 372/45.01 |
| 2010/0272140 A1 | 10/2010 | Walter et al. ............. | 372/38.02 |
| 2010/0289427 A1 | 11/2010 | Walter et al. ................. | 315/219 |
| 2011/0150487 A1 | 6/2011 | Walter .......................... | 398/115 |
| 2012/0038960 A1 | 2/2012 | Then et al. .................... | 359/108 |
| 2012/0068151 A1 | 3/2012 | Walter .............................. | 257/9 |
| 2014/0291712 A1* | 10/2014 | Juang .................... | H01L 33/502 257/98 |
| 2015/0098674 A1 | 4/2015 | Varghese ................. | G02B 6/12 |
| 2016/0020579 A1* | 1/2016 | Feng .................... | G11C 13/047 365/114 |

OTHER PUBLICATIONS

M. Feng, N. Holonyak Jr., M.K. Wu, and F. Tan, Journal of Applied Physics 121, 153103 (2017).
M. Feng, Junyi Qiu, C.Y. Wang, and N. Holonyak Jr., Journal of Applied Physics 119, 084502 (2016).
M. Feng, J. Qiu, C.Y. Wang, and N. Holonyak Jr., Journal of Applied Physics 120, 204501 (2016).
M. Feng, E. Iverson, C.Y. Wang and N. Holonyak Jr., Appl. Phys. Lett. 107, 181108 (2015).
M. Feng, N. Holonyak, Jr., G. Walter, and R. Chan, "Room Temperature Continuous Wave Operation of a Heterojunction Bipolar Transistor Laser", Appl. Phys. Lett. 87, 131103 (2005).
M. Feng, N. Holonyak, Jr. R. Chan, A. James, and G. Walter, "Signal Mixing in a Multiple Input Transistor Laser Near Threshold", Appl. Phys. Lett. 88, 063509 (2006).
R. Chan, M. Feng, N. Holonyak, Jr., A. James, and G. Walter, "Collector Current Map of Gain and Stimulated Recombination on the Base Quantum Well Transitions of a Transislui Laser", Appl. Phys. Lett. 88, 143508 (2006).
G.J. Lasher, *Solid-State Electron.* 7, 707 (1964).
K.H. Levin and C.L. Tang, *Appl. Phys. Lett.* 34, 376 (1979.
H. M. Gibbs, T.N.C. Venkatesan, S.L. McCall, A. Passner, A.C. Gossard, and W. Wiegmann, *App. Phys. Lett.* 34, 511 (1979).
D. A. B. Miller, D. S. Chemla, T.C. Damen, T. H. Wood, C. A. Burns, A.C. Gossard, and W. Wiegmann, *IEEE Journal of Quantum Electronics*, 21, No. 2, 1462 (1985).
P. Zhou, J. Cheng, C. F. Schyaus, S. Z. Sun, C. Hains, K. Zheng, E. Armour, W. Hsin, D. R. Myers, and G.A. Vawter, *IEEE Photonics Technol. Lett.* 3, pp. 1009-1012 (1991).
M. Feng, N. Holonyak, Jr., and R. Chan, *Appl. Phys. Lett.* 84, 1952 (2004).
H. W. Then, M. Feng, N. Holonyak, Jr., and C.H. Wu, *Appl. Phys. Lett.* 91, 033505 (2007).
G. Walter, C.H. Wu, H.W. Then, M. Feng, and N. Holonyak, Jr., *Appl. Phys. Lett.* 94, 231125 (2009).
G. Walter, N. Holonyak, Jr., M. Feng, and R. Chan, *Appl. Phys. Lett.* 85, 4768 (2004).
R. Chan, M. Feng, N. Holonyak, Jr., and G. Walter, *Appl. Phys. Lett.* 86, 131114 (2005).
M. Feng, H.W. Then, N. Holonyak, Jr., A. James, and G. Walter, *Appl. Phys. Lett.* 95, 033509 (2009).
H.W. Then, M. Feng, and N. Holonyak, Jr., *J. of Appl. Phys.* 107, 094509 (2010).
R. Barnbery, C. Wang, F. Tan, M. Feng, and N. Holonyak, Jr., *IEEE Photonics Technol. Lett.* 27, No. 6, 600 (2015).
W. Franz, Z. *Naturforsch.*13a, 484 (1958).
L. V. Keldysh, *Sov. Phys. JETP* 34, 788 (1958).
K. Tharmalingham, *Phys. Rev.* 130, 2204 (1963).
A. James, N. Holonyak, Jr., M. Feng, and G. Walter, *IEEE Photonics Technol. Lett.* 19, 680 (2007).
M.K. Wu, M. Feng, and N. Holonyak, Jr., *Appl. Phys. Lett.* 101, 2010 (2012).
M. Feng and N. Holonyak, Jr., Optics & Photonics News (OPN), *Optical Society of America* pp. 44-49 (OSA), Mar. (2011).
H.W. Then, M. Feng, and N. Holonyak, Jr., *Proc. IEEE*, 101, 2271 (2013).
M. Feng, Han Wui Then, and Nick Holonyak, Jr., "Transistor Laser Optical NOR Gate for High Speed Optical Logic Processors," *GOMACTech-2017* (Session 8: Beyond CMOS Technologies (Paper No. 8.4))-Reno, NV, Mar. 21, 2017.
S. K. Sekatskii and V.S. Letokhov, *Phys. Rev.* B 64, 233311 (2001).
Z.S. Wang, L.C. Kwek, C. H. Lai, and C. H. Oh, *Phys. Rev.* A 69, 052108 (2004).

* cited by examiner

TRANSISTOR LASER ELECTRICAL AND OPTICAL BISTABLE SWITCHING

FIELD OF THE INVENTION

This invention relates to transistor laser devices and techniques and, more particularly, to devices and techniques exhibiting both optical and electrical bistability for switching in a single transistor that can be operated at room temperature.

BACKGROUND OF THE INVENTION

Included in the background hereof are the teachings of U.S. Pat. No. 9,478,942 of M. Feng, N. Holonyak, Jr., and M. K. Wu, assigned to the same assignee as the present Application, and incorporated herein by reference. Reference can also be made to documents cited therein, including: U.S. Pat. Nos. 7,091,082, 7,286,583, 7,354,780, 7,535,034, 7,693,195, 7,696,536, 7,711,015, 7,813,396, 7,888,199, 7,888,625, 7,953,133, 7,998,807, 8,005,124, 8,179,937, 8,179,939, 8,494,375, and 8,509,274; U.S. Patent Application Publication Numbers US2005/0040432, US2005/0054172, US2008/0240173, US2009/0134939, US2010/0034228, US2010/0202483, US2010/0202484, US2010/0272140, US2010/0289427, US2011/0150487, and US2012/0068151; and to PCT International Patent Publication Numbers WO/2005/020287 and WO/2006/093883 as well as to the publications referenced in U.S. Patent Application Publication Number US2012/0068151.

Bistability occurs in electrical or optical systems in which there is a region where the output signal has two stable energy states for a given input. Switching between these states can be achieved by a change of input level. The input-output relation forms a hysteresis loop, thus giving the bistability. Electrical bistable devices are fundamental to digital electronics as building blocks of switches, logic gates and memories in current computer systems. For example, any arrangement of transistors (such as CMOS or BJT) achieving two distinct stable states can be used as a storage element of a static random-access memory (SRAM) cell.

Today, digital electronic computers are bandwidth limited by the signal delay of RC time constants and carrier transit times of electronic logic. To overcome these problems, optical digital computers have been considered. Optics are capable of communicating high bandwidth channels in parallel without suffering interference. Similarly, optical bistable devices are fundamental to digital photonics as building blocks of optical switches, optical logic gates and optical memories. Two features are required to realize an optical bistable device: nonlinearity and feedback (see, for example, G. J. Lasher, *Solid-State Electron.* 7, 707 (1964); K. H. Levin and C. L. Tang, *Appl. Phys. Lett.* 34, 376 (1979); H. M. Gibbs, T. N. C. Venkatesan, S. L. McCall, A. Passner, A. C. Gossard, and W. Wiegmann, *App. Phys. Lett.* 34, 511 (1979); D. A. B. Miller, D. S. Chemla, T. C. Damen, T. H. Wood, C. A. Burns, A. C. Gossard, and W. Wiegmann, *IEEE Journal of Quantum Electronics*, 21, no. 2, 1462 (1985); B. E. A. Saleh and M. C. Teich, Fundamentals of Photonics ($2^{nd}$ edition), Wiley, Section 23.4 Optical Gates.) An optical bistable system can be realized by the use of a nonlinear optical element whose output beam is used in a feedback system to control the transmission of light through the element. However, the full application of optics has yet to be applied to digital computers for reasons including the lack of suitable optical logic processors with scalable size and speed.

In 1991, semiconductor bistable photonic devices were reported based on the monolithic integration of a vertical cavity surface emitting laser (VCSEL) and a latching PNPN photothyristor (see P. Zhou, J. Cheng, C. F. Schyaus, S. Z. Sun, C. Hains, K. Zheng, E. Armour, W. Hsin, D. R. Myers, and G. A. Vawter, *IEEE Photonics Technol. Lett.* 3, pp. 1009-1012 (1991)) as well as two PNPN photothyristors (see W. K. Choi and Y. W. Choi, *Electronics Lett.* 43, No. 12 June 7 (2007). However, the major issue with a laser-photothyristor pair is that the PNPN-thyristor stores charge and has a very slow switching speed, typically in the MHz range. This fundamental limitation is owing to the saturated nature of the PNPN switching operation. Once turned on, the PNPN device accumulates large quantities of charge in its base, and takes a long time to turn off. This sets a fundamental limit to the speed of the laser-photothyristor to MHz switching. Other approaches based on external optical components such as semiconductor optical amplifiers (SOA), electro-absorption modulators (EAM) and Mach-Zehnder modulators (MZM) are limited by low coupling efficiencies and low extinction ratios. Furthermore, these components are usually built with large lateral dimensions for ease of optical coupling, and long lengths to increase the extinction ratios. Such difficulties and large device dimensions (~mm) are difficult for achieving high density integrated designs as required for logic applications.

Starting about 2004, with quantum-wells (QWs) incorporated near the collector in the of a III-V heterojunction bipolar transistor (HBT), the radiative spontaneous recombination lifetime ($\tau_{sp}$) of the device was reduced to a few picosecond (see e.g. M. Feng, N. Holonyak, Jr., and R. Chan, *Appl. Phys. Lett.* 84, 1952 (2004); H. W. Then, M. Feng, N. Holonyak, Jr., and C. H. Wu, *Appl. Phys. Lett.* 91, 033505 (2007). As a result, QW-HBTs with short base-collector metal contacts as in a two-terminal LED had demonstrated a record LED modulation bandwidth of $f_{-3dB}$~7 GHz and confirm a fast $\tau_{sp}$~23 ps operated at room temperature (G. Walter, C. H. Wu, H. W. Then, M. Feng, and N. Holonyak, Jr., *Appl. Phys. Lett.* 94, 231125 (2009)). Furthermore, the incorporation of an optical cavity for higher Q enclosing the QW-HBT provided higher photon density field-enhancement stimulated recombination, coherent light output, and invention of the transistor laser (see e.g. G. Walter, N. Holonyak, Jr., M. Feng, and R. Chan, *Appl. Phys. Lett.* 85, 4768 (2004); R. Chan, M. Feng, N. Holonyak, Jr., and G. Walter, *Appl. Phys. Lett.* 86, 131114 (2005); M. Feng, N. Holonyak, Jr., G. Walter, and R. Chan, *Appl. Phys. Lett.* 87, 131103, (2005)). The frequency response and resonance behavior of the semiconductor laser can be derived from the well-known Statz-deMars' coupled carrier-photon interaction rate equations (H. Statz and G. DeMars, Quantum Electronics, 530 (1960)). The modulation bandwidth is related to e-h radiation recombination lifetimes, photon lifetimes and cavity photon density. The transistor laser can thus improve modulation bandwidth and bit-error-rate owing to fast radiative recombination lifetimes determined by the thin base and ability of the transistor to inject and collect stored charge within picoseconds (forcing the base QW recombination to compete with E-C transport) (see M. Feng, H. W. Then, N. Holonyak, Jr., A. James, and G. Walter, *Appl. Phys. Lett.* 95, 033509 (2009); H. W. Then, M. Feng, and N. Holonyak, Jr., *J. of Appl. Phys.* 107, 094509 (2009); R. Bambery, C. Wang, F. Tan, M. Feng, and N. Holonyak, Jr., *IEEE Photonics Technol. Lett.* 27, no 6, 600 (2015).

Optical absorption for a direct-gap semiconductor can be enhanced in the presence of a static electrical field and has been explained as photon-assisted tunneling (PAT) in semiconductor surface (W. Franz, Z. Naturforsch. 13a, 484 (1958), L. V. Keldysh, Sov. Phys. JETP 34, 788 (1958); K. Tharmalingham, Phys. Rev. 130, 2204 (1963)) and used in a semiconductor PN junction diode (C. M. Wolfe, N. Holonyak, Jr., and G. E. Stillman, Physical Properties of Semiconductors, pp. 219-220, Prentice Hall, Englewood Cliffs, N.J. (1989)). However, previous studies have not included the effect of electro-optical cavity coupling and quality Q. In the transistor laser, the coherent photons generated at the base quantum-well interact with the collector field and "assist" optical cavity electron tunneling from the base valence band to the adjacent conduction band of the collector junction. As described in M. Feng, J. Qiu, C. Y. Wang, and N. Holonyak, Jr., J. Appl. Phys. 119, 084502 (2016), the optical absorption can be further enhanced by the cavity coherent photon intensity of the transistor laser.

The transistor laser intra-cavity photon-assisted tunneling (ICPAT) modulation via collector voltage (tunneling-collector voltage) is a unique property and the basis of ultrahigh speed direct laser voltage modulation and switching (see e.g. A. James, N. Holonyak, Jr., M. Feng, and G. Walter, IEEE Photonics Technol. Lett. 19, 680 (2007); M. K. Wu, M. Feng, and N. Holonyak, Jr., Appl. Phys. Lett. 101, 2010 (2012); M. Feng and N. Holonyak, Jr., Optics & Photonics News (OPN), Optical Society of America pp. 44-49 (OSA), March (2011); H. W. Then, M. Feng, and N. Holonyak, Jr., Proc. IEEE, 101, 2271 (2013).

It is among the objectives hereof to overcome limitations of existing approaches for achieving and exploiting bistability and fast switching in electro-optical circuits and techniques. It is also among the objects hereof to devise a new and improved method of operating a transistor device and modulating photon density in an optical cavity of the device.

SUMMARY OF THE INVENTION

Due to the "planar" geometry of the transistor structure, the active devices or passive components can be conveniently replicated into electrical logic building blocks (ICs) for computing and for all other traditional (electronics) information processing functions. The uniqueness of the transistor laser and its "third" port, an optical dimension, is convenient for ICs and computer. All the required components can be fabricated on a single epitaxial structure for transistor, laser, detector, and IC replication, thus facilitating the electronic-photonics integrated circuits (EOICs) on a very large scale. The transistor laser fundamentally enables the development of high-speed digital computation in the optical domain. It possesses the unique 3-port electrical and optical characteristics for directly current or voltage modulation and allows the design of ultra-high-speed integrated optical switches (see e.g. M. Feng, Han Wui Then, and Nick Holonyak, Jr., "Transistor Laser Optical NOR Gate for High Speed Optical Logic Processors," GOMACTech—2017 (Session 8: Beyond CMOS Technologies (Paper No. 8.4))— Reno, Nev., Mar. 21, 2017 and see also M. Feng, J. Qiu, C. Y. Wang, and N. Holonyak, Jr., J. Appl. Phys. 120, 20451 (2016)).

Previously, electro-optical bistablity was realized via intracavity photon-assisted tunneling, and demonstrated also in a ring-cavity transistor laser (RTL), operated at the low temperature of −50° C. (see U.S. Pat. No. 9,478,942 and M. Feng, N. Holonyak, Jr., M. K. Wu and F. Tan, J. of Appl. Phys. 121, 153103 (2017)). Optical output was measured by placing the fiber coupling to the side wall of the ring-cavity transistor laser, thus the ratio of coherent to incoherent light being proportionately reduced.

Embodiments hereof demonstrate both the collector current $I_C$-$V_{CE}$ and the optical L-$V_{CE}$ family of hystereses operating at room temperature in an edge-emitting transistor laser (EETL). The transistor laser electrical and optical bistabilities are controllable by base current ($I_B$) and collector voltage ($V_{CE}$). The current switching is due to the transistor base operation shifting between stimulated and spontaneous e-h recombination processes at the base-QW. The optical switching of coherent and incoherent energy states is owing to transistor laser cavity photon density modulation via intra-cavity photon-assisted tunneling controlled by the collector voltage. Different switching paths between optical (coherent/incoherent) and electrical (stimulated/spontaneous) energy states result in different thresholds of input collector voltage. Thus, the operation principles as physical processes and operating mechanisms in transistor laser electro-optical bistabilities are considerably different than the optical hystereses in cavities containing the nonlinear absorptive (dissipative) and dispersive gain media that were proposed and observed earlier some of which were referenced hereinabove.

Techniques hereof exploit operation in which the optically radiative portion of a transistor, including one or more quantum size regions (e.g. quantum well(s)) in the base region thereof, is effectively put inside an optical cavity, and the optical cavity controls the photon density in the system. Tunneling is used to absorb photons, and the quantum-well to generate the photons. Thus, one can voltage-tune and current-control the electrical and optical switching between coherent and incoherent state for the light, and between stimulated and spontaneous recombination for the current.

In accordance with a form of the invention, a method is set forth for electrical and optical bistable switching, including the following steps: providing a semiconductor device that includes a semiconductor base region of a first conductivity type between semiconductor collector and emitter regions of a second conductivity type, providing a quantum size region in said base region, and providing base, collector and emitter terminals respectively coupled with said base, collector, and emitter regions; providing input electrical signals with respect to said base, collector, and emitter terminals to obtain an electrical output signal and light emission from said base region; providing an optical resonant cavity that encloses at least a portion of said base region, including the junction thereof with said collector region, and the light emission therefrom, an optical output signal being obtained from a portion of the light in said optical resonant cavity; and modifying said input electrical signals to switch back and forth between a first state wherein the photon density in said cavity is below a predetermined threshold and said optical output is incoherent, and a second state wherein the photon density in said cavity is above said predetermined threshold and said optical output is coherent, said switching from said first to said second state being implemented by modifying said input electrical signals to reduce optical absorption by collector intra-cavity photon-assisted tunneling, and said switching from said second to said first state being implemented by modifying said input electrical signals to increase photon absorption by collector intra-cavity photon-assisted tunneling.

In an embodiment of this first form of the invention, said step of switching from said first state said second state includes applying a stepdownward voltage to said device to reduce photon absorption by collector intra-cavity photon-assisted tunneling, and said step of switching from said second state said first state includes applying a stepupward voltage to said device to increase photon absorption by collector intra-cavity photon-assisted tunneling. Also in this embodiment, the step of applying a stepdownward voltage to said device comprises applying a collector-emitter voltage, $V_{CE}$, below a threshold voltage, $V_{TD}$, to said device while keeping the base current, $i_B$, substantially constant, and said step of applying a stepupward voltage to said device comprises applying a collector-emitter voltage, $V_{CE}$, above said threshold voltage $V_{TD}$, to said device while keeping said base current, $i_B$, substantially constant.

In accordance with another form of the invention, a method for electro-optical bistable switching is set forth, including the following steps: providing a semiconductor device that includes a semiconductor base region of a first conductivity type between semiconductor collector and emitter regions of a second conductivity type, providing a quantum size region in said base region, and providing base, collector and emitter terminals respectively coupled with said base, collector, and emitter regions; providing electrical signals with respect to said base, collector, and emitter terminals to obtain an electrical output signal and light emission from said base region; providing an optical resonant cavity that encloses at least a portion of said base region, including the junction thereof with said collector region, and the light emission therefrom, an optical signal being obtained from a portion of the light in said optical resonant cavity; and forward sweeping a signal applied to said terminals and then backward sweeping said signal to obtain both an electrical output hysteresis characteristic of said device and an optical output hysteresis characteristic of said device.

In accordance with a further form of the invention, a method is set forth for operating a transistor device, including the following steps: providing a semiconductor device that includes a semiconductor base region of a first conductivity type between semiconductor collector and emitter regions of a second conductivity type, providing at least one quantum size region in said base region, and providing base, collector and emitter terminals respectively coupled with said base, collector, and emitter regions; providing input electrical signals with respect to said base, collector, and emitter terminals to obtain an electrical output signal and light emission from said base region; providing an optical resonant cavity that encloses at least a portion of said base region, including the junction thereof with said collector region, and the light emission therefrom; and operating said device to modulate the photon density in said cavity, by controlling photon generation by said at least one quantum size region and controlling photon absorption by intra-cavity photon-assisted tunneling.

In an embodiment of this further form of the invention, said step of providing an optical resonant cavity comprises providing lateral reflectors to form an edge-emitting cavity configuration, and in another embodiment, said step of providing an optical resonant cavity comprises providing vertical reflectors to form a vertical cavity configuration. In these embodiments, the step of operating said device to modulate the photon density in said cavity can comprise controlling the base current and collector voltage of said semiconductor device.

Room temperature operation of both the electrical and optical bistability of a transistor laser are demonstrated. An electro-optical hysteresis with sharp square corners and different voltage thresholds of the collector $I_C$-$V_{CE}$ and L-$V_{CE}$ characteristics operating at 20 and 10° C. for the step-upward and step-downward operations are observed and are complementary. Because of the switching path differences between coherent and incoherent cavity photon densities reacting with collector voltage modulation via intra-cavity photon-assisted tunneling (ICPAT)) resulting in the collector voltage difference in switch-UP and switch-DOWN operations, the TL bistability is realizable, controllable, and usable. The operations of the electro-optical hysteresis and bistability in the compact form of the transistor laser can be employed, for example for high speed optical logic gate and flip-flop applications. As indicated, room temperature operation is also demonstrated.

Further features and advantages of the invention will become more readily apparent from the following detailed description when taken in conjunction with the accompanying drawings.

BRIEF DESCRIPTION OF THE DRAWINGS

FIG. 2 includes FIG. 2(a) and FIG. 2(b). FIG. 2(a) is a scanning electron micrograph of top view of the QW transistor laser with cavity length L=200 μm, and FIG. 2(b) is a focused ion beam (FIB) micrograph of a cross-section of the edge-emitting transistor laser revealing the material and device layers.

FIG. 5 includes FIG. 5(a) and FIG. 5(b). In these Figures there is shown transistor laser electro-optical hysteresis of the collector $I_C$-$V_{CE}$ (FIG. 5(a)), and the optical L-$V_{CE}$ ($I_B$) output characteristics (@ 20° C.) with threshold $I_{TH}$=43.4 mA (FIG. 5(b)). In FIG. 5(a) when $V_{CE}$ increases from 2 to 3 V, the forward collector $I_C$-$V_{CE}$ and optical L-$V_{CE}$ characteristics for the base current $I_B$=72 to 90 mA (step $\Delta I_B$=3 mA) exhibit sharp current and optical switching at switch-UP voltage ($V_{TU}$) for a given base current (solid line). In FIG. 5(b) when $V_{CE}$ decreases from 3 to 2 V, the backward $I_C$-$V_{CE}$ and L-$V_{CE}$ characteristics exhibit sharp current and optical switching at switch-DOWN voltage $V_{TD}$ (dotted line).

FIG. 6 includes FIG. 6(a) and FIG. 6(b). In these Figures there is shown transistor laser electrical hysterisis of the collector $I_C$-$V_{CE}$ (FIG. 6(a)), and optical hysteresis of the light L-$V_{CE}$ characteristics operating at 10° C. at a fixed base current $I_B$=84 mA (FIG. 6(b)). EETL bistable states for a given $V_{CE}$=2.58 V are realized between lower electrical energy state (0) with a stimulated and higher optical energy state (coherent) and higher electrical energy state (1) with a spontaneous and lower optical energy state (incoherent). It can be observed that there is a voltage threshold difference between switch-UP $V_{TU}$=2.6 V and switch-DOWN $V_{TD}$=2.56 V which yields electro-optical hysteresis and bistability.

FIG. 7 includes FIG. 7(i) and FIG. 7(ii). In these Figures there is shown transistor laser electro-optical hysterisis and bistability operating at 20° C. for a given $I_B$=84 mA ($I_{TH}$=43 mA). The current difference is $\Delta I_C$=15 mA and the optical light difference is $\Delta L$=1 mW at $V_{TU}$(switch-UP)=2.60 V and $V_{TD}$ (switch-DOWN)=2.56 V. A transistor laser electro-optical bistability is consequently realized and demonstrated at $V_{CE}$=2.58 V between the coherent state (0) and the incoherent state (1).

FIG. 8 includes FIG. 8(i) and FIG. 8(ii). In these Figures there is shown transistor laser electro-optical hysterisis and bistability operating at 10° C. for a given $I_B$=84 mA ($I_{TH}$=33 mA). The current difference is $\Delta I_C$=25 mA and the optical light difference is $\Delta L$=2 mW at $V_{TU}$(switch-UP)=3.46 V and $V_{TD}$ (switch-DOWN)=3.40 V. A transistor laser electro-optical bistability is realized and demonstrated at $V_{CE}$=3.43 V between the coherent state (0) and the incoherent state (1).

DETAILED DESCRIPTION

Figure 1:
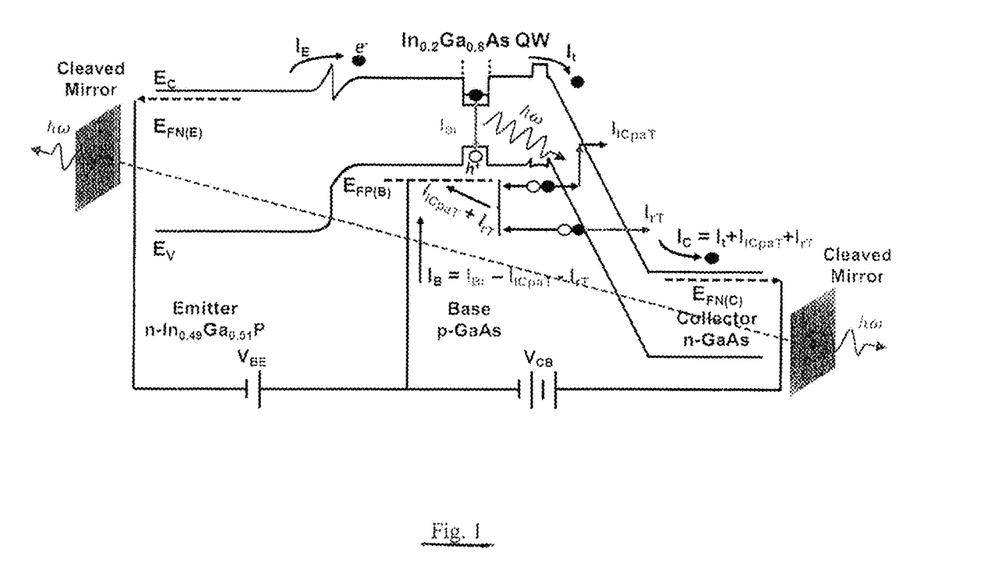
FIG. 1 is a schematic energy diagram of a quantum-well (QW) edge-emitting transistor laser as used in embodiments hereof, operating by e-h recombination in the base-QW and photon absorption by intra-cavity photon-assisted tunneling (ICPAT) at the collector junction. The collector current $I_C = I_t + I_{ICPAT} + I_{rT}$ where $I_t = \beta_t \times I_B + \beta_2 \times (I_{ICPAT} + I_{rT})$.

The schematic energy band diagram of a heterojunction transistor laser (n-p-n) with a quantum-well (QW) in the base, photon-assisted tunneling at the collector junction, and a reflecting optical cavity are shown in FIG. 1 operating with emitter current injection, base recombination and transport, and tunneling collector current. The base recombination hole current ($I_{Br}$) is supplied by the external base current ($I_B$), the intracavity photon-assisted tunneling hole current ($I_{ICPAT, h}$), and the band-to-band tunneling hole current ($I_{rT}$). The collector electron current ($I_C$) is contributed from the base electron current reaching the collector junction (It), the intracavity photon-assisted tunneling electron current ($I_{ICPAT, e}$), and the band-to-band tunneling electron current ($I_{rT}$). The photon generation is due to e-h recombination at base quantum-well, and the photon absorption is due to intra-cavity photon-assisted e-h tunneling at the collector junction. The corresponding hole current contributes to the base for electron relaxation transport and excess (injected) carrier spontaneous and stimulated recombination, thus providing at the collector tunneling-modulation of the laser and tunneling-amplification of the transistor (see also M. Feng, J. Qiu, C. Y. Wang, and N. Holonyak, Jr., *J. Appl. Phys.* 120, 20451 (2016)). The cleaved mirrors provide the optical cavity with a photon "trap" and leads to the coherent light and laser output when the photon density is above the coherent threshold.

Figures 2, 2A, 2B:
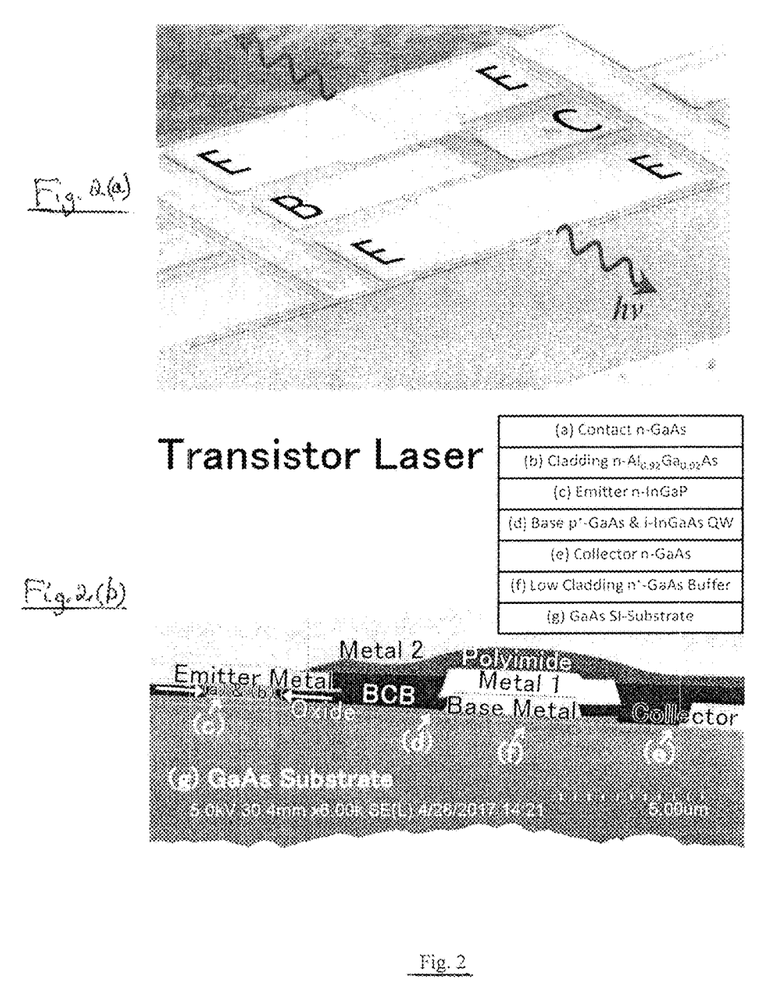

A quantum-well transistor laser (QWTL) that has been designed and fabricated for improved performance as used in accordance with a form of the invention is illustrated in FIG. 2(a) which shows a scanning electron micrograph of the top view of the coplanar common-emitter TL device and in FIG. 2(b) which shows a focused ion beam (FIB) micrograph of a cross-section of the edge-emitting TL. The QWTL in FIG. 2(a) has an emitter cavity width of ~2 μm and a cleaved cavity length ~200 μm and the emitter, base, and collector contacts denoted as "E", "B", and "C", respectively. In FIG. 2(b), from the GaAs semi-insulating substrate (g) upward, the epitaxial structure of the transistor laser includes a 5000 Å heavily doped n-type GaAs buffer layer (f) and also 5000 Å of n-type $Al_{0.95}Ga_{0.05}As$ serves as the lower cladding. The collector (e) includes a layer of $Al_{0.4}Ga_{0.6}As$ that serves as a sub-collector and a 1000 Å lightly doped n-type GaAs collector layer. The base (d) comprises a conduction energy barrier (81 meV) formed by a 100 Å layer of heavily C-doped p-type $Al_{0.1}Ga_{0.9}As$, and a 910 Å heavily doped p-type GaAs base layer. Within the base region (d), there is incorporated an undoped 150 Å $In_xGa_{1-x}As$ QW designed for emission at λ≈980 nm. On top of the base is a 400 Å lightly doped n-type $In_{0.49}Ga_{0.51}P$ emitter layer (c). A 5000 Å n-type $GaAs/Al_{0.92}Ga_{0.08}As$ top cladding layer (b) is grown on top of the emitter. A 1000 Å heavily doped n-type GaAs emitter contact layer (a) caps the stack of layers. [Alternatively, the device can be configured as a vertical cavity device with upper and lower reflectors, for example distributed Bragg reflectors (DBRs).]

Figure 3:
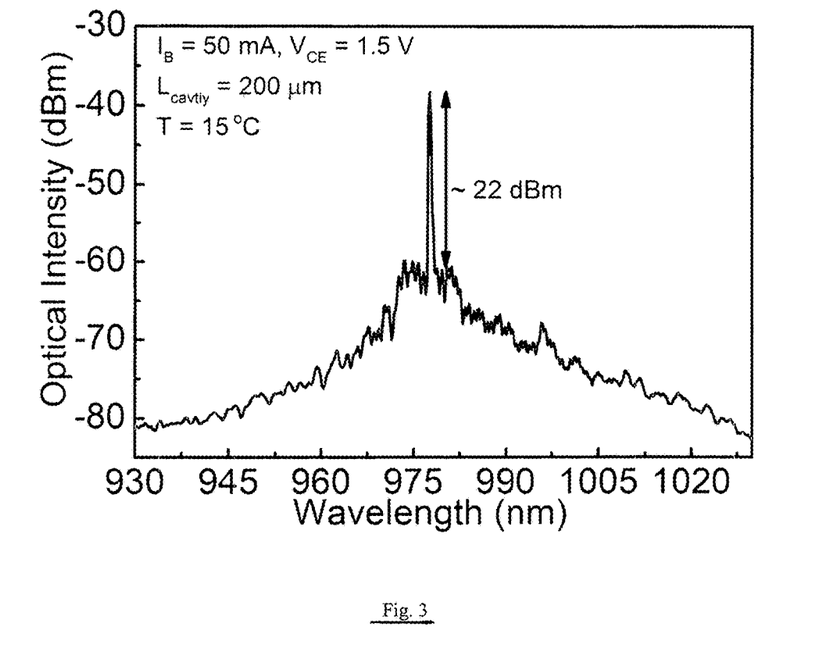
FIG. 3 is a graph of emission spectra of the edge-emitting transistor laser (EETL) of a cavity length L=200 μm operating at 15° C., $I_B$=50 mA, and $V_{CE}$=1.5V.

FIG. 3 shows the transistor laser spectrum μm, with peak wavelength at 977 nm operating at $I_B$=50 mA and $V_{CE}$=1.5V at 15° C. The two-headed arrow shows the peak relative amplitude of 22 dBm.

Figures 4, 4I:
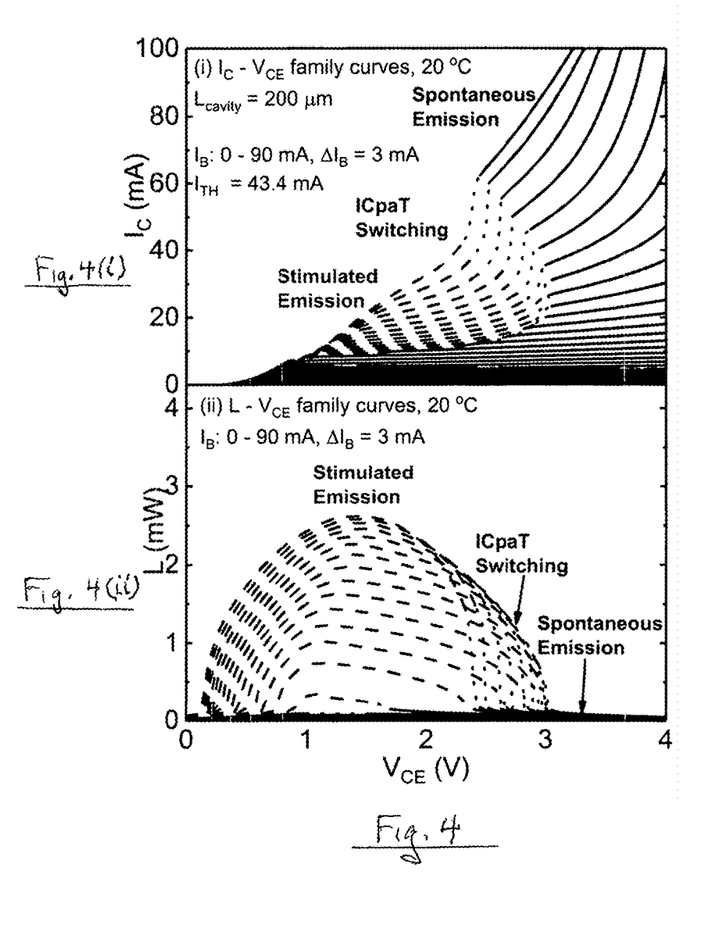
FIG. 4 includes FIG. 4(i) and FIG. 4(ii), with graphs for the 200 μm transistor, laser (i) Collector $I_C$-$V_{CE}$ and (ii) L-$V_{CE}$ characteristics, operating at 20° C. exhibiting a sharp current step-change and different ICPAT voltage switching (dotted lines). Four distinct operating regions are evident: (1) spontaneous recombination below threshold, $I_{TH}$=43 mA (solid line), (2) stimulated recombination and coherent light above threshold (dashed line), (3) collector current and light output switching from stimulated to spontaneous recombination and emission at switch-UP voltages $V_{TU}(I_B)$ (dotted line), and (4) spontaneous recombination and emission above current threshold and above voltage threshold $V_{TU}$ (solid line).

A 200 μm cavity EETL operating at 20° C. shows the measured outputs of (i) the collector $I_C$-$V_{CE}$ and (ii) the optical L-$V_{CE}$ family of characteristics in FIG. 4. As seen in the Figure, the collector $I_C$-$V_{CE}$ characteristics with a step-upward collector voltage exhibit sharp current changing at switch-UP voltage ($V_{TU}$) as $V_{CE}$ increases from 0 to 4 V and $I_B$ increases from 0 to 90 mA with steps of $\Delta I_B$=3 mA. Four different operating regions are identified: (1) the spontaneous region below base current threshold $I_{TH}$=43 mA (solid line), (2) laser stimulated region above base current threshold (dashed line), (3) the $I_{ICPAT}$ switch-UP region (dotted line), and (4) the spontaneous region above base current threshold ($I_{TH}$) and above collector voltage threshold ($V_{TH}$) (solid line). This device shows the unique signature of TL operation: collector current gain compression at the laser threshold current $I_{TH}$=43 mA. This unique characteristic is attributed to the change in base recombination lifetime as the device shifts operation from "slow" spontaneous (solid line) in region (1) to "faster" stimulated recombination (dashed line) in region (2).

The dotted line region (3) in the $I_C$-$V_{CE}$ family of characteristics represents electrical switching in the operation due to the base-QW shifting from stimulated to spontaneous recombination. The transistor operates in spontaneous recombination after collector $I_{ICPAT}$ switching (solid line) region (4). The dotted line region (3) in the L-$V_{CE}$ family of characteristics represents optical switching owing to the cavity operation shifting from coherent to incoherent via intra-cavity photon assisted-tunneling. The transistor laser operates in incoherent recombination after collector $I_{ICPAT}$ switching, thus, yielding only incoherent light output at low intensity (solid line region).

For investigating the switching behavior by amplifying region in FIG. 4, the step-upward (forward) collector $I_C$-$V_{CE}$ family of characteristics at 20° C. (solid line) in FIG. 5(a) exhibits sharp current change at switch-UP voltage ($V_{TU}$) as $V_{CE}$ increases from 2 to 3 V and $I_B$ increases from 72 to 90 mA with steps of $\Delta I_B$=3 mA. For a given $I_B$=84 mA ($I_{TH}$=43 mA), the current difference is $\Delta I_C$=15 mA at $V_{TU}$=2.60 V. When $V_{CE}$ decreases from 3 to 2 V for step-downward (backward) operation, current switching at different switch-DOWN voltage ($V_{TD}$) characteristics (dotted line) is exhibited in FIG. 5(a). For a given $I_B$=84 mA ($I_{TH}$=43 mA), the current difference is $\Delta I_C$=15 mA at $V_{TD}$=2.56 V.

Figure 6A:
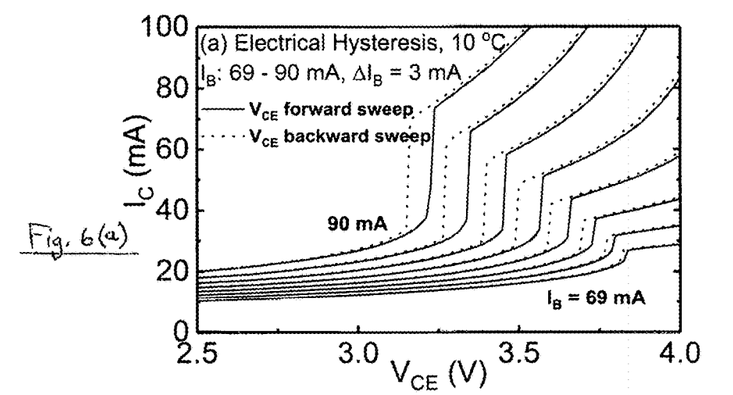

When the device is operated at 10° C. and the threshold is reduced to $I_{TH}$=33 mA, the forward collector $I_C$-$V_{CE}$ family of characteristics (solid line) in FIG. 6(a) exhibit sharper current change at $V_{TU}$ from 2.5 to 4 V and $I_B$ increases from 69 to 90 mA with steps of $\Delta I_B$=3 mA. For a given $I_B$=84 mA ($I_{TH}$=33 mA), the current difference improves to $\Delta I_C$=25 mA at $V_{TU}$=3.46 V. When $V_{CE}$ decreases from 4 to 2.5 V for backward operation, different corner current switching at switch-DOWN voltage ($V_{TD}$) characteristics (dotted line) are exhibited in FIG. 6(b). For $I_B$=84 mA, the current difference increases to $\Delta I_C$=25 mA at $V_{TD}$=3.4 V. Due to the difference in switch-UP and switch-DOWN voltage, the electrical hystereses in the collector $I_C$-$V_{CE}$ family of characteristics are demonstrated at 20° C. and 10° C., respectively, The physical mechanism of switch-UP can be explained by the base-QW shifting operation from stimulated to spontaneous recombination when the optical absorption rate by ICPAT increases with $V_{CE}$ and exceeds the stimulated photon generation rate at the base-QW for a given base current, the cavity photon density then drops below coherent threshold resulting in switching at switch-UP voltage $V_{TU}$. After switching, the transistor is operating under spontaneous but above laser current threshold $I_{TH}$. The mechanism of switch-DOWN can be explained by the base-QW shifting operation from spontaneous to stimulated (lasing) recombination when the optical absorption rate decreases with $V_{CE}$ and is lower than the spontaneous photon generation rate, the cavity photon density (incoherent) increases above the coherent threshold resulting in switching at switch-DOWN voltage $V_{TD}$.

Figure 5A:
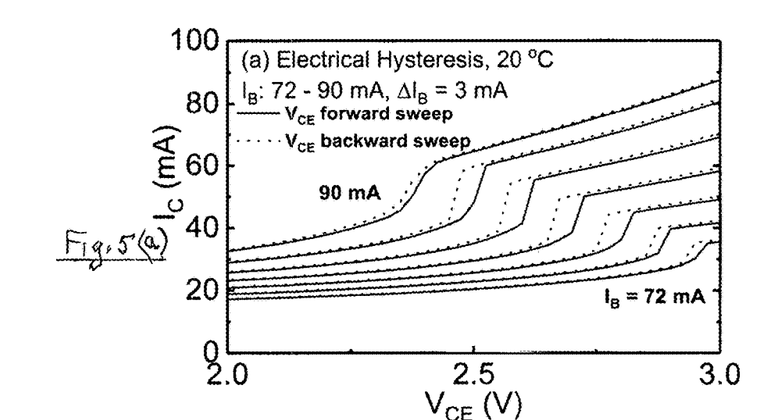

It can be observed that the output collector current ($I_C$) and the input collector voltage ($V_{CE}$) relation forms a hysteresis loop for a given base current above the laser current threshold. There is a threshold difference in switch-UP and switch-DOWN voltages and results in the hysteresis loop as shown in FIGS. 5(a) and 6(a). Also, the hysteresis loop area increases and switching slope reduces with temperature decreases. Thus, the electrical hysteresis family of characteristics is programmable with base current ($I_B$), collector voltage ($V_{CE}$), and the junction temperature.

Figure 5B:
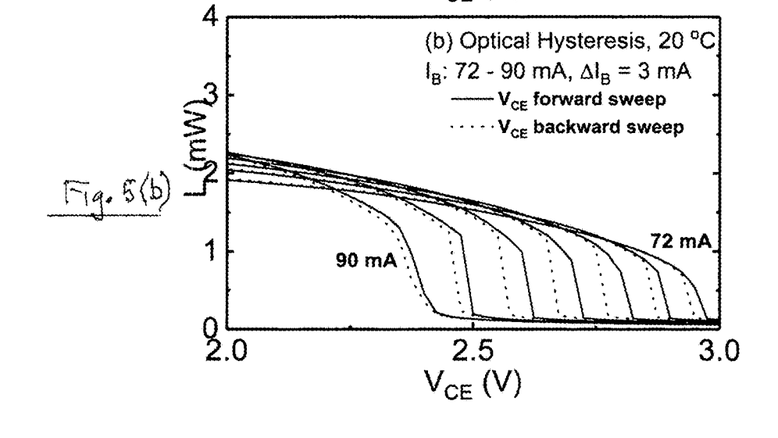

FIG. 5(b) displays the TL step-upward (forward) optical L-$V_{CE}$ ($I_B$) family of characteristics operating at 20° C. When $V_{CE}$ increases from 2 to 3 V and $I_B$ increases from 72 to 90 mA with steps $\Delta I_B$=3 mA, the forward L-$V_{CE}$ characteristics exhibit sharp optical change at $V_{TU}$ in FIG. 5(b) (solid line) (e.g., $\Delta L$=1 mW for $I_B$=84 mA and $V_{TU}$=2.6 V). When $V_{CE}$ decreases from 3 to 2 V, the backward L-$V_{CE}$ characteristics exhibit optical change at $V_{TD}$ in FIG. 5 (b) (e.g., $\Delta L$=1 mW for $I_B$=84 mA and $V_{TD}$=2.56 V (dotted line).

Figure 6B:
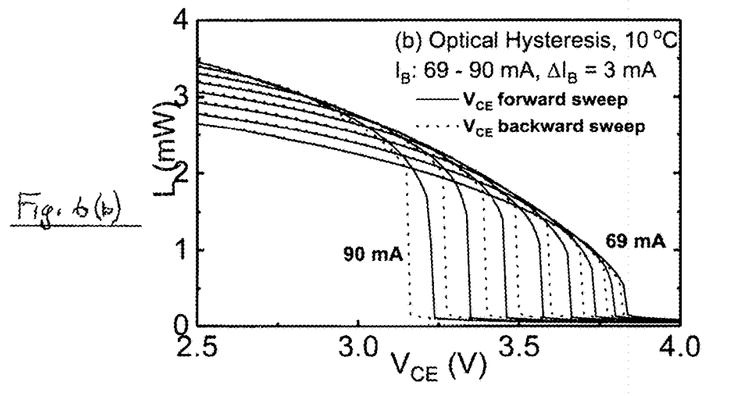

FIG. 6(b) displays the TL forward and backward optical L-$V_{CE}$ ($I_B$) family of characteristics operating @ 10° C. When $V_{CE}$ increases from 2.5 to 4 V and $I_B$ increases from 69 to 90 mA with steps $\Delta I_B$=3 mA, the forward optical L-$V_{CE}$ characteristics exhibit sharp optical change at $V_{TU}$ in FIG. 6(b) (solid line) (e.g., $\Delta L$=1.5 mW for $I_B$=84 mA and $V_{TU}$=3.45 V). Forward optical switching @ 10° C. in FIG. 6(b) (corresponding to forward electrical switching as shown in FIG. 6(a)) is due to the optical cavity shifting operation from coherent to incoherent. When the optical absorption rate by ICPAT increases with $V_{CE}$ and is greater than the optical generation rate at the base-QW, the cavity photon density drops below coherent threshold resulting in optical switching at $V_{TU}$=3.45V.

When $V_{CE}$ decreases from 4 to 2.5 V, the backward L-$V_{CE}$ characteristics operating @ 10° C. exhibit optical step-change at $V_{TD}$ in FIG. 6(b) (dotted line) (e.g., $\Delta L$=1.5 mW for $I_B$=84 mA and $V_{TD}$=3.4 V). Optical backward switching is owing to the optical cavity shifting operation from incoherent to coherent. When the optical absorption rate decreases with $V_{CE}$ and is below the photon generation rate, the cavity photon density increases above the threshold resulting in coherent light output.

Figures 7, 7I:
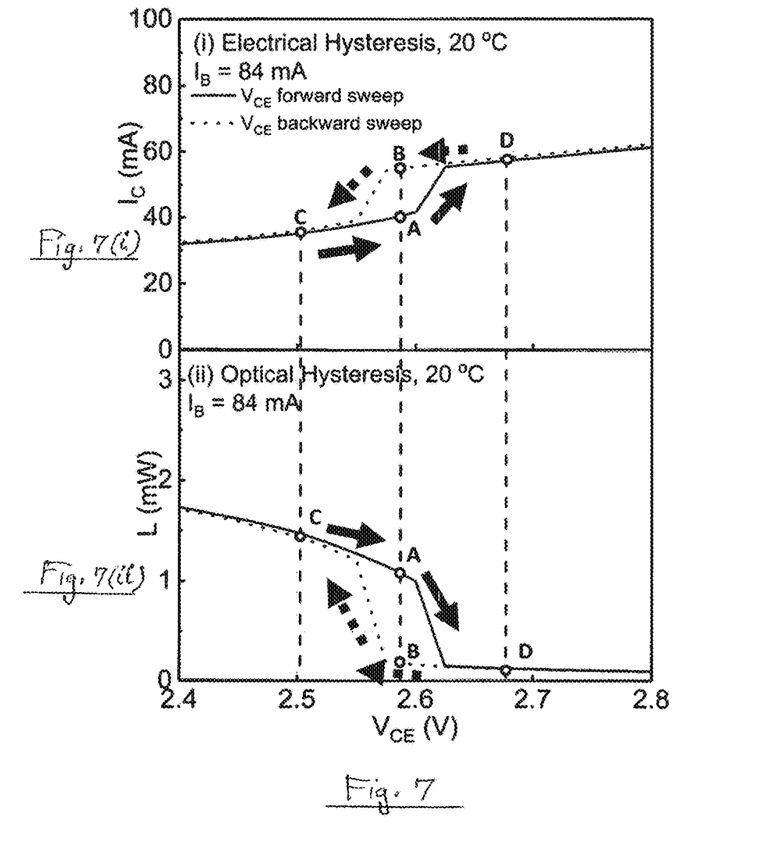

FIG. 7(i) shows the electrical hysteresis of the collector current $I_C$-$V_{CE}$ and FIG. 7(ii) shows the optical hysteresis of the optical L-$V_{CE}$ at 20° C. for a fixed $I_B$=84 mA. When $V_{CE}$ increases from 2.5 to 2.58 V, the $I_C$ and L move forward from point (C) to (A). The base operation is in stimulated recombination, and the light output is coherent. The cavity photon density reduces by increasing of ICPAT optical absorption rate with a nearly constant QW optical generation rate limited by a fixed $I_B$=84 mA. When $V_{CE}$ increases from 2.58 to 2.67 V, the $I_C$ and L (solid line) move forward from (A) to (D). The cavity operation shifts from coherent to incoherent when the cavity photon density reduces below the threshold at $V_{TU}$=2.6 V by further increase of ICPAT photon absorption rate and the base operation shifts from stimulated to spontaneous recombination. The current difference is $\Delta I_C$=15 mA and the optical light difference is $\Delta L$=1 mW at $V_{TU}$=2.6 V.

When $V_{CE}$ decreases from 2.67 to 2.58 V in FIG. 7(ii), the $I_C$ and L (dotted line) move backward from point (D) to (B). The base-QW operates in spontaneous recombination and the light is incoherent. When $V_{CE}$ decreases from 2.58 to 2.5 V, the $I_C$ and L (dotted line) moves backward from point (B) to (C). The base shifts operation from spontaneous to stimulated recombination at $V_{TD}$=2.56 V and the light output shifting from incoherent to coherent (laser) with further reduction of photon absorption rate by ICPAT. For a given $I_B$=84 mA ($I_{TH}$=43 mA), the current difference is $\Delta I_C$=15 mA and the optical light difference is $\Delta L$=1 mW at $V_{TD}$=2.56 V. A transistor laser electro-optical bistability is consequently realized and demonstrated at $V_{CE}$=2.58 V between the coherent state (A) and the incoherent state (B).

Figures 8, 8I:
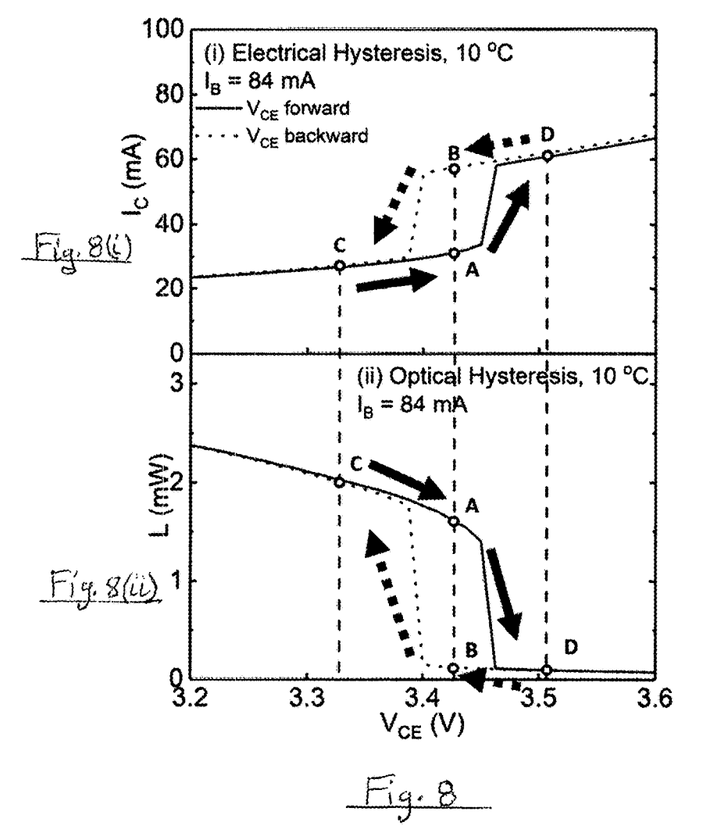

FIG. 8(i) demonstrates the electrical hysteresis of the collector current $I_C$-$V_{CE}$ and FIG. 8(ii) displays the optical hysteresis in L-$V_{CE}$ at 10° C. for $I_B$=84 mA with a $I_{TH}$=33 mA. When $V_{CE}$ increases from 3.33 to 3.43 V, the $I_C$ and L (solid line) move forward from point (C) to (A). The light output is coherent with the base operating in stimulated recombination. When $V_{CE}$ further increases from 3.43 to 3.51 V, the $I_C$ and L (solid line) move forward from point (A) to (D). The cavity operation shifts from coherent to incoherent with the photon density reduced below the coherent threshold at $V_{TU}$=3.46 V by further increase of ICPAT photon absorption rate. As a result, the base operation shifts from stimulated to spontaneous recombination. The current difference is $\Delta I_C$=25 mA and the light difference is $\Delta L$=2 mW at $V_{TU}$=3.46 V.

When $V_{CE}$ decreases from 3.51 to 3.43 V in FIG. 8 (ii), the $I_C$ and L (dotted line) move backward from point (D) to (B). The base operates in spontaneous recombination, the light is incoherent. When $V_{CE}$ further decreases from 3.43 to 3.33 V, the $I_C$ and L (dotted line) move backward from point (B) to (C). The light output shifts from incoherent to coherent (laser) with further reduction of photon absorption by ICPAT at $V_{TD}$=3.4 V. As a result, the base shifts operation from spontaneous to stimulated recombination. The current difference is $\Delta I_C$=25 mA and the optical light difference is $\Delta L$=2 mW at $V_{TD}$=3.4 V. It can be observed that the switching current and light difference are improved considerably with reduced device temperature in FIGS. 7 and 8. Transistor laser electro-optical bistability is thus realized and demonstrated at $V_{CE}$=3.43 V between the coherent state (A) and the incoherent state (B).

Figure 9:
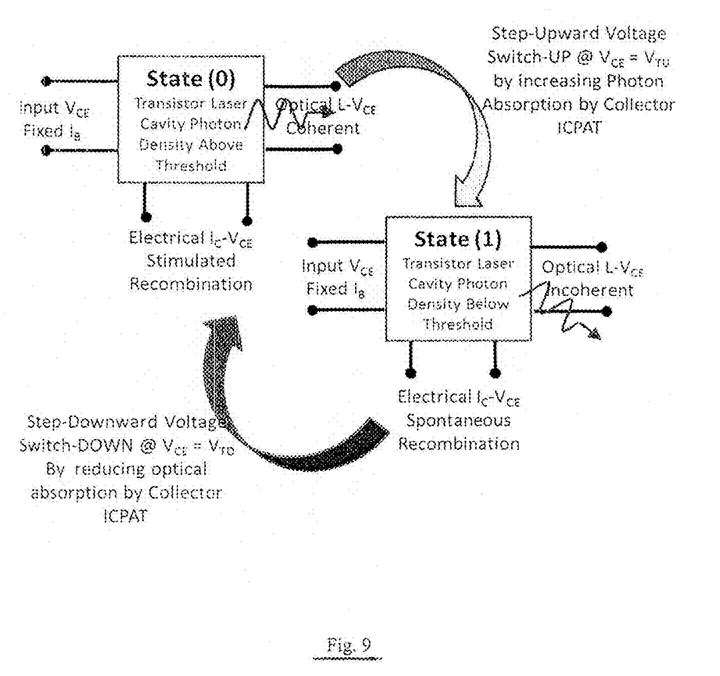
FIG. 9 is a state diagram showing the step-up and step-down technique and states which exploit the electro-optical bistability characteristics of a transistor laser.

FIG. 9 illustrates schematically the paths of bistability operation of the transistor laser. A three-port transistor laser with cavity photon density above laser threshold is labeled as a coherent energy state (0), the transistor operating under stimulated recombination in the base-QW providing lower collector current output and coherent light (laser) output. A transistor laser with cavity photon density below laser threshold is labeled as an incoherent energy state (1), the transistor operating under spontaneous recombination in the base-QW providing higher collector current output and incoherent light (light-emitting transistor) output. The switching from state (0) to state (1) is achieved by the reduction of cavity photon density below coherent threshold via increasing photon absorption rate with intra-cavity photon-assisted tunneling by increasing collector voltage above the switch-UP threshold ($V_{CE} \geq V_{TU}$) for a given base current ($I_B$). The switching from incoherent state (1) to coherent state (0) is achieved by the increase of cavity photon density above laser threshold via reducing photon absorption rate by decreasing collector voltage below collector switch-DOWN threshold ($V_{CE} \leq V_{TD}$) for a given base current ($I_B$).

The time delay for the electrical and optical switch-UP is expected to be advantageously short due to fast intra-cavity photon-assisted tunneling reducing the cavity photon density below the incoherent voltage threshold since the quantum tunneling time is characterized as ~6 to 8 fs by field emission microscopy (see S. K. Sekatskii and V. S. Letokhov, *Phys. Rev.* B 64, 233311 (2001)) and calculates to be 20 to 50 fs (see Z. S. Wang, L. C. Kwek, C. H. Lai, and C. H. Oh, *Phys. Rev. A* 69, 052108 (2004)). The time delay for the electrical and optical switch-DOWN is expected to be relatively longer owing to the slow photon generation rate via spontaneous e-h recombination (10-50 picosecond HBT-LET) building up the cavity photon density above the coherent voltage threshold. The electrical and optical hysteresis demonstrated for the transistor laser are due to the time delay of different operational paths of e-h and photon recombination/generation in forward and backward switching.

Room temperature operation of both the electrical and optical bistability of a transistor laser have been demonstrated. An electro-optical hysteresis with sharp square corners and different voltage thresholds of the collector $I_C$-$V_{CE}$ and L-$V_{CE}$ characteristics operating at 20 and 10° C. for the step-upward and step-downward operations are observed and are complementary. Because of the switching path differences between coherent and incoherent cavity photon densities reacting with collector voltage modulation via intra-cavity photon-assisted tunneling (ICPAT)) resulting in the collector voltage difference in switch-UP and switch-DOWN operations, the TL bistability is realizable, controllable, and usable. The operations of the electro-optical hysteresis and bistability in the compact form of the transistor laser can be employed, for example, for high speed optical logic gate and flip-flop applications.

The invention claimed is:

1. A method for electrical and optical bistable switching, comprising the steps of:
   providing a semiconductor device that includes a semiconductor base region of a first conductivity type between semiconductor collector and emitter regions of a second conductivity type, providing a quantum size region in said base region, and providing base, collector and emitter terminals respectively coupled with said base, collector, and emitter regions;
   providing input electrical signals with respect to said base, collector, and emitter terminals to obtain an electrical output signal and light emission from said base region;
   providing an optical resonant cavity that encloses at least a portion of said base region, including the junction thereof with the collector region, and the light emission therefrom, an optical output signal being obtained from a portion of the light in said optical resonant cavity; and
   modifying said input electrical signals to switch back and forth between a first state wherein the photon density in said cavity is below a predetermined threshold and said optical output is incoherent, and a second state wherein the photon density in said cavity is above said predetermined threshold and said optical output is coherent, said switching from said first to said second state being implemented by modifying said input electrical signals to reduce optical absorption by collector intra-cavity photon-assisted tunneling, and said switching from said second to said first state being implemented by modifying said input electrical signals to increase photon absorption by collector intra-cavity photon-assisted tunneling.

2. The method as defined by claim 1, wherein said step of switching from said first state said second state includes applying a stepdownward voltage to said device to reduce photon absorption by collector intra-cavity photon-assisted tunneling.

3. The method as defined by claim 1, wherein said step of switching from said second state said first state includes applying a stepupward voltage to said device to increase photon absorption by collector intra-cavity photon-assisted tunneling.

4. The method as defined by claim 2, wherein said step of applying a stepdownward voltage to said device comprises applying a collector-emitter voltage, $V_{CE}$, below a threshold voltage, $V_{TD}$, to said device while keeping the base current, $i_B$, substantially constant.

5. The method as defined by claim 3, wherein said step of applying a stepupward voltage to said device comprises applying a collector-emitter voltage, $V_{CE}$, above a threshold voltage, $V_{TD}$, to said device while keeping the base current, $i_B$, substantially constant.

6. A method for electro-optical bistable switching, comprising the steps of:
   providing a semiconductor device that includes a semiconductor base region of a first conductivity type between semiconductor collector and emitter regions of a second conductivity type, providing a quantum size region in said base region, and providing base, collector and emitter terminals respectively coupled with said base, collector, and emitter regions;
   providing electrical signals with respect to said base, collector, and emitter terminals to obtain an electrical output signal and light emission from said base region;
   providing an optical resonant cavity that encloses at least a portion of said base region, including the junction thereof with the collector region, and the light emission therefrom, an optical signal being obtained from a portion of the light in said optical resonant cavity; and
   forward sweeping a signal applied to said terminals and then backward sweeping said signal to obtain both an electrical output hysteresis characteristic of said device and an optical output hysteresis characteristic of said device.

7. The method as defined by claim 6, wherein said hysteresis is controllable with the device collector voltage.

8. The method as defined by claim 6, wherein said hysteresis is controllable with the device base current.

9. The method as defined by claim 6, wherein said hysteresis is controllable with the device collector voltage and base current.

10. The method as defined by claim 6, wherein said method is applied in an electro-optical flip-flop application.

11. The method as defined by claim 6, wherein said method is applied in an electro-optical logic application.

12. The method as defined by claim 6, wherein said method is applied in an electro-optical memory application.

13. A method for operating a transistor device, comprising the steps of:
- providing a semiconductor device that includes a semiconductor base region of a first conductivity type between semiconductor collector and emitter regions of a second conductivity type, providing at least one quantum size region in said base region, and providing base, collector and emitter terminals respectively coupled with said base, collector, and emitter regions;
- providing input electrical signals with respect to said base, collector, and emitter terminals to obtain an electrical output signal and light emission from said base region;
- providing an optical resonant cavity that encloses at least a portion of said base region, including the junction thereof with said collector region, and the light emission therefrom; and
- operating said device to modulate the photon density in said cavity, by controlling photon generation by said at least one quantum size region and controlling photon absorption by intra-cavity photon-assisted tunneling, said step of operating said device to modulate the photon density in said cavity including switching from a first state of transistor operation to a second state of transistor operation by applying a stepdownward voltage to said device to reduce photon absorption by collector intra-cavity photon-assisted tunneling; and
- said step of operating said device to modulate the photon density in said cavity further including switching from said second state of transistor operation to said first state of transistor operation by applying a stepupward voltage to said device to increase photon absorption by collector intra-cavity photon-assisted tunneling.

14. The method as defined by claim 13, wherein said step of providing an optical resonant cavity comprises providing lateral reflectors to form an edge-emitting cavity configuration.

15. The method as defined by claim 13, wherein said step of providing an optical resonant cavity comprises providing vertical reflectors to form a vertical cavity configuration.

16. The method as defined by claim 13, wherein in said first state the photon density in said cavity is below a predetermined threshold and said light emission is incoherent, and in said second state the photon density in said cavity is above said predetermined threshold and said light emission is coherent.

17. The method as defined by claim 13, wherein said step of operating said device to modulate the photon density in said cavity comprises controlling the base current and collector voltage of said semiconductor device.

18. The method as defined by claim 15, wherein an optical output signal is obtained from a portion of the light in said optical resonant cavity.

19. The method as defined by claim 14, wherein an optical output signal is obtained from a portion of the light in said optical resonant cavity.

* * * * *